United States Patent
Banister et al.

(10) Patent No.: US 8,473,798 B1
(45) Date of Patent: *Jun. 25, 2013

(54) ENCODING AND DECODING SYSTEMS AND RELATED METHODS

(75) Inventors: Brian A. Banister, Moscow, ID (US);
Patrick Owsley, Moscow, ID (US);
Sean M. Collison, Veradale, WA (US)

(73) Assignee: Comtect EF Data Corp., Tempe, AZ (US)

( * ) Notice: Subject to any disclaimer, the term of this patent is extended or adjusted under 35 U.S.C. 154(b) by 492 days.

This patent is subject to a terminal disclaimer.

(21) Appl. No.: 12/729,027

(22) Filed: Mar. 22, 2010

Related U.S. Application Data

(60) Provisional application No. 61/161,843, filed on Mar. 20, 2009.

(51) Int. Cl.
*G06F 11/00* (2006.01)

(52) U.S. Cl.
USPC .......................................... 714/746

(58) Field of Classification Search
USPC .............. 714/746, 751, 752, 755, 758, 786, 714/794, 795, 801, 819; 375/262, 341; 341/94
See application file for complete search history.

(56) References Cited

U.S. PATENT DOCUMENTS

| | | | |
|---|---|---|---|
| 5,388,124 A * | 2/1995 | Laroia et al. | 375/286 |
| 6,202,189 B1 * | 3/2001 | Hinedi et al. | 714/786 |
| 6,697,885 B1 * | 2/2004 | Goodfellow | 710/22 |
| 6,771,196 B2 * | 8/2004 | Hsiun | 341/106 |
| 6,940,928 B2 * | 9/2005 | Cameron | 375/341 |
| 6,956,872 B1 * | 10/2005 | Djokovic et al. | 370/505 |
| 7,039,846 B2 * | 5/2006 | Hewitt et al. | 714/755 |
| 7,085,987 B2 * | 8/2006 | Hewitt et al. | 714/755 |
| 7,095,341 B2 * | 8/2006 | Hsiun | 341/67 |
| 7,113,554 B2 * | 9/2006 | Dielissen et al. | 375/341 |
| 7,242,726 B2 * | 7/2007 | Cameron et al. | 375/295 |
| 7,421,638 B2 * | 9/2008 | Hewitt et al. | 714/755 |
| 8,209,579 B2 * | 6/2012 | Belogolovy | 714/752 |
| 2002/0026615 A1 * | 2/2002 | Hewitt et al. | 714/752 |
| 2004/0019842 A1 * | 1/2004 | Argon et al. | 714/755 |
| 2005/0265387 A1 * | 12/2005 | Khojastepour et al. | 370/467 |
| 2009/0019334 A1 * | 1/2009 | Tomlinson et al. | 714/755 |
| 2010/0146372 A1 * | 6/2010 | Tomlinson et al. | 714/780 |
| 2012/0026022 A1 * | 2/2012 | Banister et al. | 341/94 |

* cited by examiner

*Primary Examiner* — Phung M Chung
(74) *Attorney, Agent, or Firm* — Booth Udall Fuller, PLC

(57) ABSTRACT

A method of searching for candidate codewords for a telecommunications system may comprise receiving a constellation point, comparing the received point with points within a Dorsch decoding process using an optimal pattern, and terminating the search when a codeword is found residing within a specified distance of the received point.

20 Claims, 5 Drawing Sheets

ENCODING AND DECODING SYSTEMS AND RELATED METHODS

CROSS REFERENCE TO RELATED APPLICATIONS

This document claims the benefit of the filing date of U.S. Provisional Patent Application 61/161,843, entitled "Encoding and Decoding Systems and Related Methods" to Banister et al., which was filed on Mar. 20, 2009, the disclosure of which is hereby incorporated entirely herein by reference.

BACKGROUND

1. Technical Field

Aspects of this document relate generally to systems and methods for transmitting data across a telecommunication channel.

2. Background Art

In a telecommunication system, an encoded codeword of a linear block code may be sent across a noisy channel, such as a wireless communication link or other connection. Bits of the codeword may be initially assigned values of either −1 or 1 when first placed in the channel. As the bits travel across the channel, noise in the channel can increase or weaken the magnitude of a particular sent bit. On the receiving side, once the noisy codeword is acquired by the decoder, the codeword may be called a received vector. The decoder's purpose is to examine the received vector and find the codeword that was originally sent. Finding the original sent codeword may involve a Euclidean squared distance calculation or correlation between the received vector and a collection of candidate codewords. The candidate codeword that is the least square distance (Euclidean distance) from the received vector or possesses the largest correlation with the received vector is generally selected as the most likely codeword that was sent.

SUMMARY

In one aspect, a method of searching for candidate codewords for a telecommunications system may comprise receiving a constellation point, comparing the received point with points within a Dorsch decoding process using an optimal pattern, and terminating the search when a codeword is found residing within a specified distance of the received point.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

Figure 1:
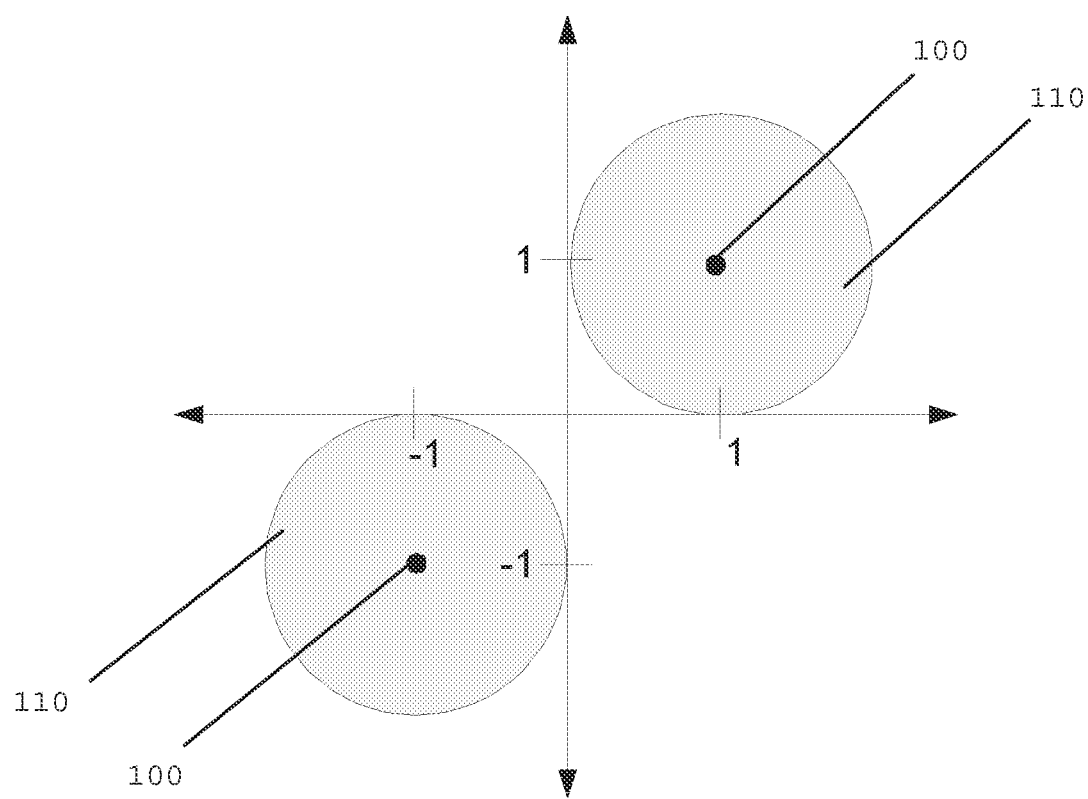
FIG. 1 is a graphic illustration of a locus of points shaded in gray that are less than a fixed square distance from a codeword.

Implementations of a method of searching for the candidate codewords in a Dorsch decoding process using an optimal pattern are disclosed. A Dorsch decoder is unusual in that it is not necessary to know how to construct a decoder for a given code. The decoding is accomplished by using an encoder multiple times to iteratively search for the closest codeword to a received vector. Non-limiting examples of implementations of methods for terminating the search when a codeword is found residing within a specified distance of the received point are disclosed. In addition, various non-limiting examples of implementations of a method for selectively mapping the received point onto a hypercube when computing the distance to a given candidate codeword are also disclosed. In implementations of encoding and decoding systems disclosed in this document and the appendix to the previously filed provisional application, the disclosure of which was previously incorporated herein by reference, the various method and system implementations may serve to minimize the average number of codewords that will need to be evaluated during the decoding process, correspondingly impacting the speed (data rates) at which the decoder can be operated. Additionally, non-limiting examples of how multiple decoder instantiations can be interconnected to increase the overall throughput of the decoder are disclosed.

In implementations of a method of searching for the candidate codewords in a Dorsch decoding process using an optimal pattern and in implementations of a method of terminating the search when a codeword is found residing within a specified distance of the received point, the collection of candidate codewords to test with the received vector can be generated in an ordered manner such that the probability of each successive codeword occurring is monotonically decreasing. This process enables the most probable codewords for matching to be checked first.

A codeword for an (n,k) linear block code will contain n bits, k of which can used to uniquely represent the original data that was to be sent (prior to being encoded into a codeword). These k bits can arbitrarily be copied to the first k bits of the encoded codeword, whereas the remaining n-k bits are parity bits, generated using the first k bits and an encoding process. When an encoded n-bit codeword is sent over a noisy channel, the magnitudes of each of the sent bit positions become either more or less confident. The received vector can be sorted by the magnitude (or confidence) of each of its bit positions, with bits of the largest magnitude appearing first, and the bits with the least magnitude occurring last. In the sorted vector, the k most confident bits of the received vector can now be treated as if they were the original user data that was sent and the n-k least confident bits can be treated as the parity bits during the candidate codeword generation and distance calculation/correlation process.

The process of generating candidate codewords requires creating perturbations to the first k bits (user data) of the base codeword of the sorted received vector and then using the perturbations in the comparison process. The sorted received vector may have a base codeword, represented by each of the k most likely bit positions being mapped to a −1 if the bit position value is less than 0, and 1 otherwise. The remaining n-k bit positions are generated as if a codeword was being encoded with the first k bits, but with a modified generation method. In implementations of encoding and decoding methods disclosed in this document, the methods include steps that determine how to choose a collection of the first k bit positions to use during perturbation of the base codeword to enable generation of new candidate codewords.

If the noise on the communication channel can be described as Additive White Gaussian Noise (though the noise may take any other form in various implementations), the magnitude of each of the received bit positions can be classified as an LLR (log likelihood ratio), describing the log of the probability that one received bit position takes on one sent value versus the probability that the received position takes on the opposite value. The value of the LLR function monotonically increases for increasing received magnitudes. To introduce error patterns in a simple way, each of the k most reliable points in the received vector may be quantized to a fixed number of levels with a uniform integer scalar quantizer. Perturbation points may then be chosen if they are equal to a target LLR sum, or if any combination of the quantized points would reach that sum. A perturbation point may then have a hard decision value in the base codeword flipped and subsequently, a new codeword may be generated and tested using the perturbation point. If two points are included in a candidate codeword, the probability of both occurring simultaneously is described by the sum of each point's quantized magnitude. Accordingly, if the LLR sum starts at zero and increases by one only after all possible quantized magnitudes of the k most-reliable positions have been used to try to reach that sum, candidate codewords will be tried in decreasing order of probability of occurrence, to maximize the opportunity for a matching codeword to be found at the beginning of the evaluation. For the exemplary purposes of this disclose, an example is provided illustrating a particular evaluation flow of selection of candidate codewords for a (7,4) Hamming code. In the example, the notation p1, p2, etc. represents a parity bit.

Received Vector: [1.1, −1.8, 0.4, −0.3, 1, 0.4, −1.1]
Quantized Received Vector: [11, −18, 4, 3, 10, 4, −11]
Sorted Quantized Received Vector: [−18, 11, −11, 10, 4, 4, 3]
Base Codeword: [−1, 1, −1, 1, p1, p2, p3]
The first k magnitudes of the sorted quantized received vector that are used to form the LLR sum: [18, 11, 11, 10].
Evaluation of Target LLR sum values:
1-9
  No perturbations can be made at these levels since the sum is below any of the possible magnitudes.
10
  A single sum can be formed by using item 4 of the first k magnitudes in the perturbation. Thus the candidate codeword [−1, 1, −1, −1, p1, p2, p3] should be checked, where p1, p2, p3 are parity bits generated using the modified codeword generation method.
11
  Two different sums can be formed using either item 2 or item 3 of the first k magnitudes in the perturbation. Candidate codewords
  [−1, −1, −1, 1, p1, p2, p3] and
  [−1, 1, 1, 1, p1, p2, p3] are equiprobable.
12-17
  No perturbations can be made at these levels since no components can be combined to form these sums.
18
  A single sum can be formed by using item 1 of the first k magnitudes in the perturbation. Thus the candidate codeword [1, 1, −1, 1, p1, p2, p3] should be checked.
19-20
  No perturbations can be made at these levels since no components can be combined to form these sums.
21
  Two different sums can be formed using item 4 and either items 2 or 3 of the first k magnitudes in the perturbation. The candidate codewords
  [−1, 1, 1, −1, p1, p2, p3] and
  [−1, −1, −1, −1, p1, p2, p3] are equiprobable.
22
  A single sum at this level can be formed using items 2 and 3 of the first k magnitudes in the perturbation forming the candidate codeword:
  [−1, −1, 1, 1, p1, p2, p3].

The foregoing evaluation process may be continued until all possible candidate codewords have been generated or a fixed number of candidate codewords have been generated. If a candidate codeword is within a fixed squared distance of the received vector, it can be deemed to be the codeword that was sent across the channel and no further codewords may be tested or generated.

In implementations of a method for selectively mapping the received point onto a hypercube when computing the distance to a given candidate codeword, when a squared distance calculation is made between a received vector, r, and candidate codeword, c, a bit position (dimension) in the codeword, $c_i$, may have the same sign as the corresponding position (dimension), $r_i$, in the received vector r. If both points agree in sign for a given dimension, and the magnitude of r in that dimension is greater than 1, there is a distance contribution that may be referred to as being 'bad' in that dimension. This overly confident position is good for a correlation measurement between the two vectors but is undesirable for a squared distance calculation because the distance is contributed from a dimension that has a high probability of being correct.

Figure 2:
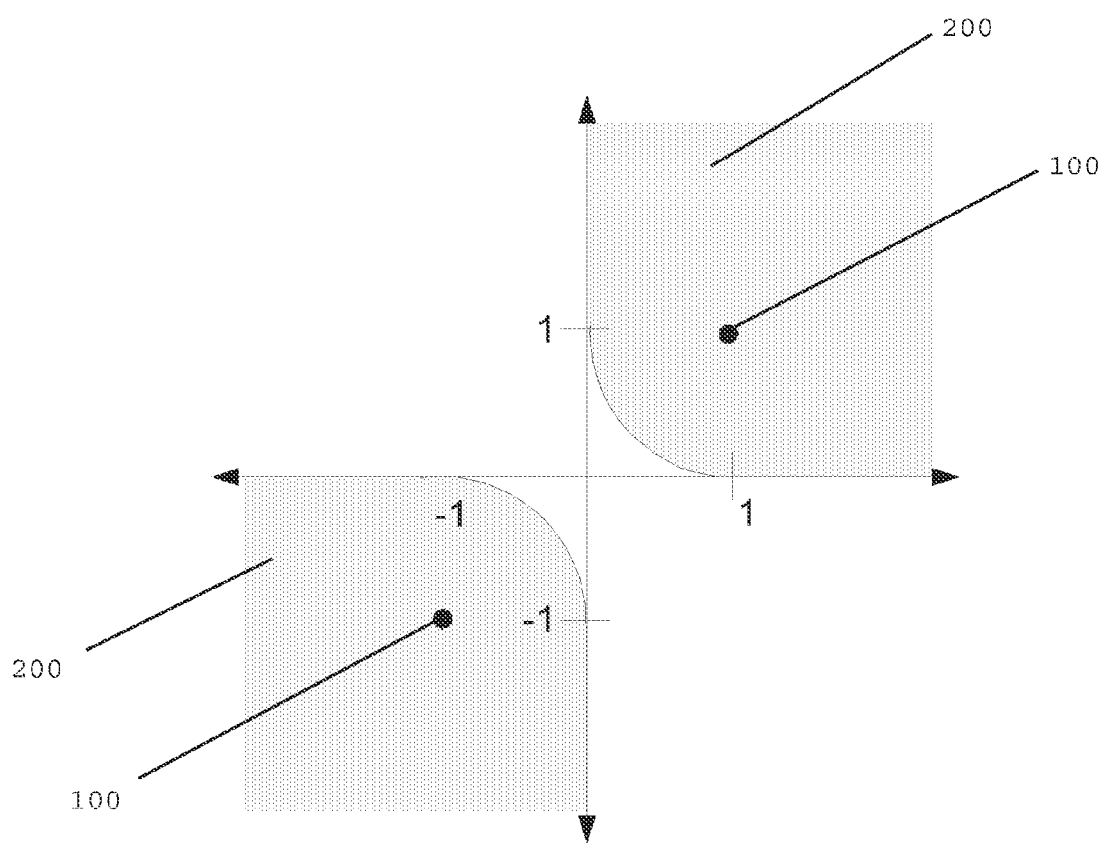
FIG. 2 is a graphic illustration of a new locus of points that would be less than a fixed squared distance from the codeword, with the bad distance removed.

In implementations of the method, the bad distance is not included if the sign of a received bit position matches the sign of the same bit position in the prospective codeword and the magnitude of the received bit position is greater than 1. This effectively maps bit positions made extra confident by noise back onto a hyper-cube containing codewords as vertices when computing the distance from the candidate codeword. FIG. 1 shows a locus of points 110 shaded in gray that are less than a fixed square distance from a codeword 100. Any received point in a gray region maps to the codeword 100 at the center of the region. FIG. 2 shows a new locus of points 200 that would be less than a fixed squared distance from the codeword 100, with the bad distance removed. Comparing FIG. 1 to FIG. 2, it is observed that FIG. 2 includes significantly more area than FIG. 1, permitting a candidate codeword to be deemed the codeword that was sent across the channel for significantly more received vectors. Moreover, there is no corresponding increase in the probability of falsely declaring a candidate codeword as the correct codeword when terminating the search process.

Figure 3:
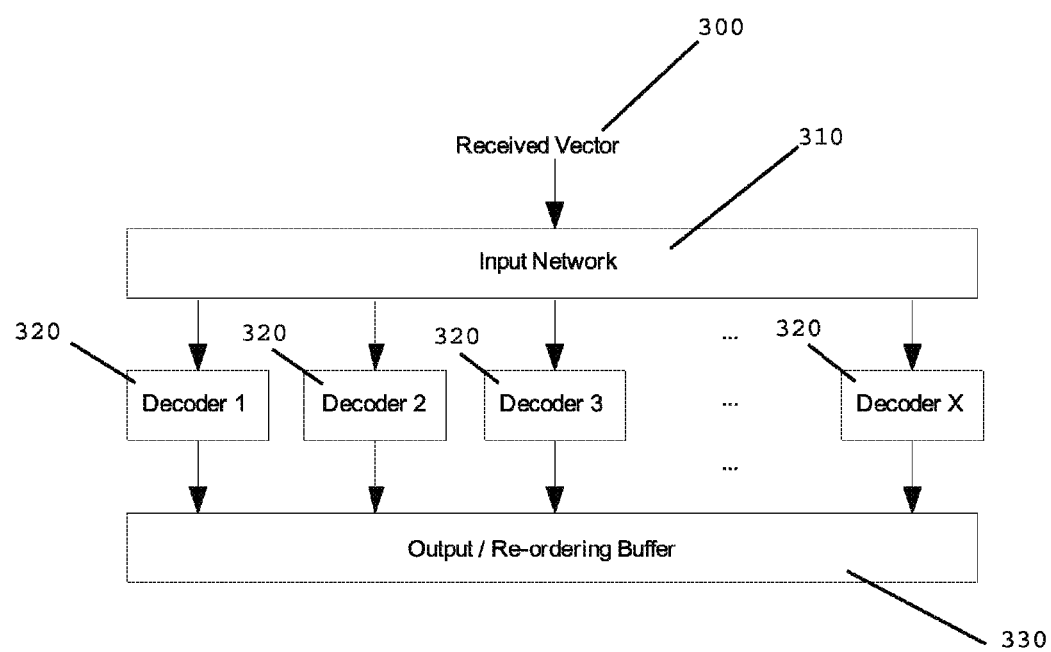
FIG. 3 is a block diagram of a particular implementation of a decoder network that includes multiple decoders.
Figure 4:
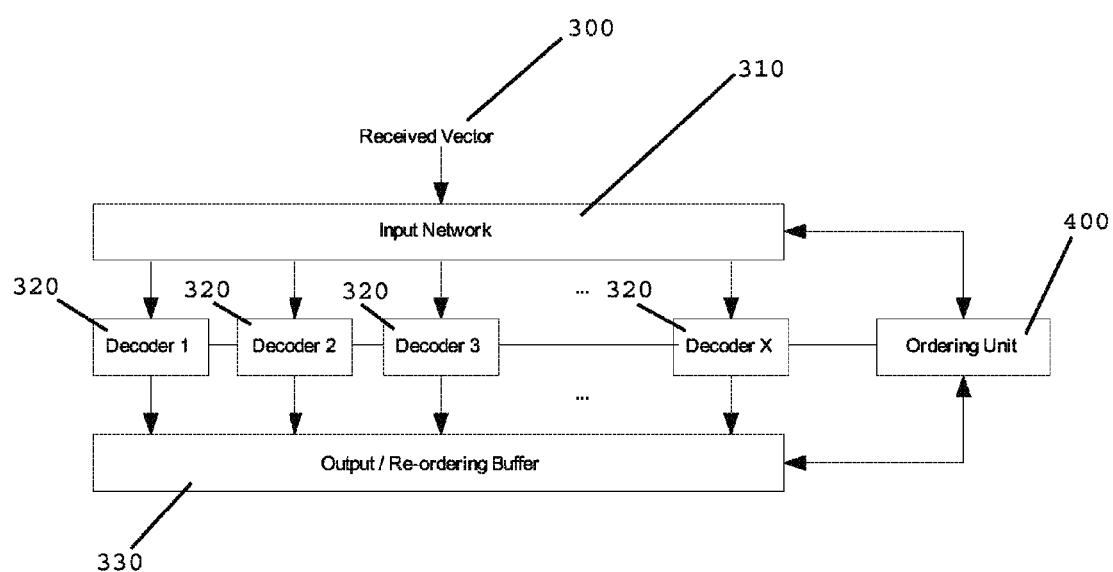
FIG. 4 is a block diagram of another particular implementation of a decoder network that utilizes a separate ordering unit to tabulate the order of the received vectors.

In implementations of a method of placing decoders like those disclosed in this document and in the appendix in an interconnected network, the overall decoding speed of a stream of received vectors 300 may be increased. In an interconnected network 310 any individual decoder 320 implementing the methods described in this document may be assigned any received vector 300. Each decoder 320 will decode the assigned received vector 300, and signal that decoding is complete, releasing the best match codeword into an output buffer 330. The output buffer, 330 which can be of any size, may release best match codewords in the order they were originally received to a downstream receiver. The array of decoders may permit one received vector to be worked on for an extended period of time, while still allowing other codewords to be simultaneously decoded. For exemplary purposes, FIG. 3 is provided to show how a particular implementation of a decoder network that includes multiple decoders 320 arranged to increase decoding speeds. As illustrated in the diagram, the decoders 320 keep track of a unique identifier for each received vector 300 which allows each vector to be identified in the order it was received. FIG. 4 illustrates another implementation of a decoder network is that utilizes a separate ordering unit 400 to tabulate the order of the received vectors 300. Any of a wide variety of arrangements is possible.

Figure 5:
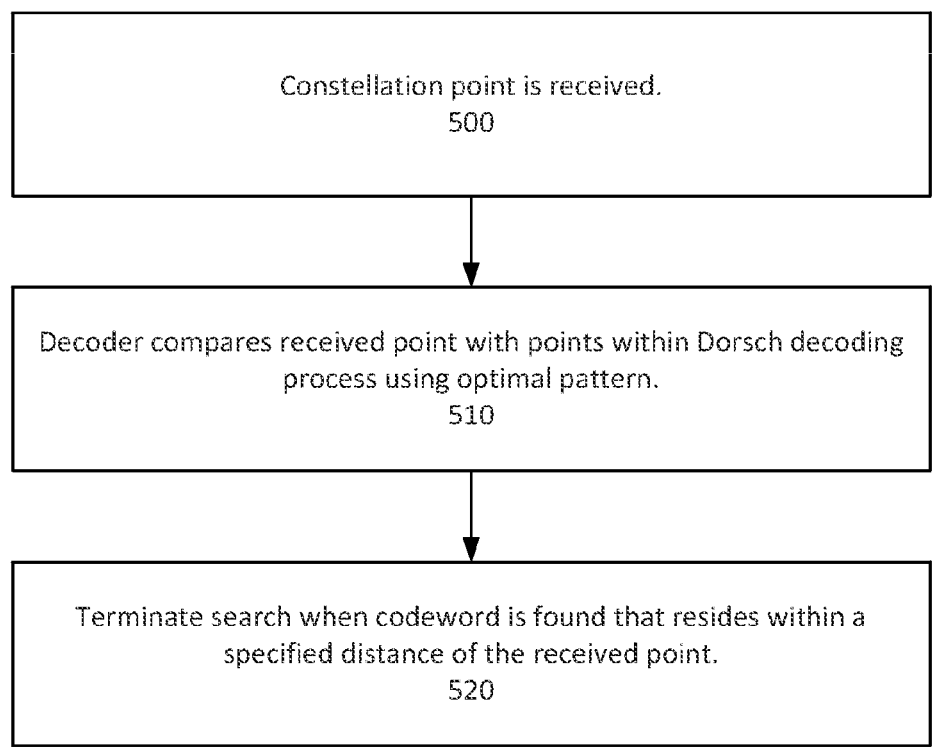
FIG. 5 is a block diagram of an implementation of a method of searching for candidate codewords.

FIG. 5 is a block diagram of an implementation of a method of searching for candidate codewords. As shown, a constellation point is received by an input network 500. One or more decoders then compares the received point with points within a Dorsch decoding process using an optimal pattern 510. The search is terminated when a codeword is found that resides within a specified distance of the received point 520.

Implementations of encoding and decoding systems and related methods may reduce the average number of codewords that will need to be evaluated during the decoding process, reduce the average number of codewords evaluated while not substantially increasing the risk of error despite significantly more received vectors possibly being deemed the codeword that was sent across the channel without increasing the probability of a false identification, and significantly increase the speed at which the stream can be processed due to multiple decoders decoding a stream of received vectors.

The materials used for implementations of encoding and decoding systems may be made of conventional materials used to make goods similar to these in the art, such as, by non-limiting example, plastic, metals, semiconductor materials, and composites. Those of ordinary skill in the art will readily be able to select appropriate materials and manufacture these products from the disclosures provided herein.

The implementations listed here, and many others, will become readily apparent from this disclosure. From this, those of ordinary skill in the art will readily understand the versatility with which this disclosure may be applied.

The invention claimed is:

1. A method of searching for candidate codewords for a telecommunications system, the method comprising:
    receiving, by a network of decoders, a received vector comprised of a plurality of received bit positions;
    comparing, by one or more of the decoders, distances between the received vector and more than one of a plurality of candidate codewords within a Dorsch decoding process using an optimal candidate codeword generation pattern; and
    terminating the search when a codeword is found by the one or more decoders that resides within a specified distance of the received vector.

2. The method of claim 1, wherein the codeword that is found within the specified distance of the received vector is a best match codeword.

3. The method of claim 2, further comprising releasing, by the one or more decoders, the best match codeword to an output buffer.

4. The method of claim 3, further comprising releasing a plurality of best match codewords by the output buffer to a receiver based on an order in which the best match codewords are received by the output buffer.

5. The method of claim 4, wherein the order of probability of comparison runs from a higher probability of finding the matching codeword to a lower probability of finding the matching codeword at each of the candidate codewords.

6. The method of claim 1, further comprising simultaneously comparing a plurality of received vectors by a plurality of decoders within the Dorsch decoding process using the optimal pattern.

7. The method of claim 1, further comprising recording, by the one or more decoders, a unique identifier for the received vector.

8. The method of claim 7, further comprising identifying an order of received vectors based on the unique identifier recorded by the one or more decoders.

9. The method of claim 1, further comprising tabulating an order of receipt for a plurality of received vectors using an ordering unit.

10. The method of claim 1, wherein the received vector is compared with candidate codewords based on an order of probability of finding a matching codeword at each of the candidate codewords.

11. A system for searching for candidate codewords within a telecommunications system, the system comprising:
    a network of decoders configured to receive a received vector comprised of a plurality of received bit positions;
    wherein one or more of the decoders is configured to compare distances between the received vector and more than one of a plurality of candidate codewords within a Dorsch decoding process using an optimal candidate codeword generation pattern and terminate the search when a codeword is found by the one or more decoders that resides within a specified distance of the received vector.

12. The system of claim 11, wherein the codeword that is found within the specified distance of the received vector is a best match codeword.

13. The system of claim 12, further comprising an output buffer configured to receive the best match codeword from the one or more of the decoders.

14. The system of claim 13, wherein the output buffer is further configured to release a plurality of best match codewords to a receiver based on an order in which the best match codewords are received by the output buffer.

15. The system of claim 14, wherein the order of probability of comparison runs from a higher probability of finding the matching codeword to a lower probability of finding the matching codeword at each of the candidate codewords.

16. The system of claim 11, further comprising a plurality of decoders that is configured to simultaneously compare a plurality of received vectors within the Dorsch decoding process using the optimal pattern.

17. The system of claim 11, wherein the one or more of the decoders is further configured to record a unique identifier for the received vector.

18. The system of claim 17, wherein the one or more of the decoders is further configured to identify an order of received vectors based on the unique identifier recorded by the one or more decoders.

19. The system of claim 11, further comprising an ordering unit configured to tabulate an order of receipt for a plurality of received vectors.

20. The system of claim 11, wherein the received vector is compared with candidate codewords based on an order of probability of finding a matching codeword at each of the candidate codewords.

* * * * *

UNITED STATES PATENT AND TRADEMARK OFFICE
CERTIFICATE OF CORRECTION

| | |
|---|---|
| PATENT NO. | : 8,473,798 B1 |
| APPLICATION NO. | : 12/729027 |
| DATED | : June 25, 2013 |
| INVENTOR(S) | : Brian A. Bansiter et al. |

It is certified that error appears in the above-identified patent and that said Letters Patent is hereby corrected as shown below:

Title page, Item (73), Assignee appears as "Comtect EF Data Corp." and should read
--Comtech EF Data Corp.--

Signed and Sealed this
Seventeenth Day of September, 2013

Teresa Stanek Rea
*Deputy Director of the United States Patent and Trademark Office*